United States Patent
Rocha-Alvarez et al.

(10) Patent No.: US 6,932,092 B2
(45) Date of Patent: Aug. 23, 2005

(54) METHOD FOR CLEANING PLASMA ENHANCED CHEMICAL VAPOR DEPOSITION CHAMBER USING VERY HIGH FREQUENCY ENERGY

(75) Inventors: Juan Carlos Rocha-Alvarez, Sunnyvale, CA (US); Maosheng Zhao, Santa Clara, CA (US); Shankar Venkataraman, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 132 days.

(21) Appl. No.: 10/302,350

(22) Filed: Nov. 22, 2002

(65) Prior Publication Data

US 2004/0099281 A1 May 27, 2004

(51) Int. Cl.[7] ............................................. B08B 6/00
(52) U.S. Cl. ................ 134/1.1; 134/22.1; 134/22.18; 134/31; 134/902; 438/905
(58) Field of Search ........................... 134/1.1, 22.1, 134/22.18, 31, 902, 21; 438/905; 216/63, 67, 68, 79

(56) References Cited

U.S. PATENT DOCUMENTS

| | | | |
|---|---|---|---|
| 4,786,352 A | * | 11/1988 | Benzing ................ 156/345.48 |
| 5,000,113 A | | 3/1991 | Wang et al. |
| 5,294,858 A | | 3/1994 | Nakahata et al. |
| 5,463,978 A | | 11/1995 | Larkin et al. |
| 5,466,728 A | | 11/1995 | Babcock et al. |
| 5,556,501 A | | 9/1996 | Collins et al. ............... 156/345 |
| 5,627,079 A | | 5/1997 | Gardella, Jr. et al. |
| 5,656,123 A | | 8/1997 | Salimian et al. ............. 156/345 |
| 5,707,486 A | | 1/1998 | Collins et al. ........... 156/643.1 |
| 5,824,607 A | | 10/1998 | Trow et al. .................. 438/732 |
| 5,843,239 A | * | 12/1998 | Shrotriya ..................... 134/1.1 |
| 5,882,424 A | * | 3/1999 | Taylor et al. ................. 134/1.1 |
| 5,886,067 A | | 3/1999 | Li et al. |
| 5,905,117 A | | 5/1999 | Yokotsuka et al. |
| 5,935,374 A | | 8/1999 | Ito et al. ...................... 156/345 |
| 6,054,379 A | | 4/2000 | Yau et al. .................... 438/623 |
| 6,068,729 A | * | 5/2000 | Shrotriya ................ 156/345.26 |
| 6,099,747 A | * | 8/2000 | Usami .......................... 216/37 |
| 6,103,781 A | | 8/2000 | Li et al. |
| 6,142,096 A | | 11/2000 | Sakai et al. .................. 118/723 |
| 6,238,751 B1 | | 5/2001 | Mountsier .................... 427/574 |
| 6,287,943 B1 | | 9/2001 | Fujioka et al. .............. 438/485 |
| 6,287,990 B1 | | 9/2001 | Cheung et al. ............. 438/780 |
| 6,312,793 B1 | | 11/2001 | Grill et al. ................... 428/312 |
| 6,340,628 B1 | | 1/2002 | Van Cleemput et al. .... 438/586 |
| 6,346,177 B2 | * | 2/2002 | Leiphart .................. 204/192.3 |
| 6,352,945 B1 | | 3/2002 | Matsuki et al. ............. 438/778 |
| 6,383,955 B1 | | 5/2002 | Matsuki et al. ............. 438/790 |
| 6,410,102 B1 | * | 6/2002 | Hashizume et al. ........ 427/534 |
| 6,410,463 B1 | | 6/2002 | Matsuki ...................... 438/790 |
| 6,525,144 B1 | | 2/2003 | Tanahashi et al. |
| 6,531,193 B2 | | 3/2003 | Fonash et al. |
| 6,596,627 B2 | | 7/2003 | Mandal |
| 6,767,836 B2 | * | 7/2004 | San et al. .................... 438/710 |
| 6,797,643 B2 | | 9/2004 | Rocha-Alvarez et al. |
| 2001/0021590 A1 | | 9/2001 | Matsuki et al. ............. 438/780 |
| 2001/0051308 A1 | | 12/2001 | Kawamura et al. |
| 2002/0001924 A1 | | 1/2002 | Fujioka et al. .............. 438/485 |
| 2002/0016085 A1 | | 2/2002 | Huang et al. ............... 438/798 |
| 2002/0197849 A1 | | 12/2002 | Mandal |
| 2003/0008155 A1 | | 1/2003 | Hayashi et al. |
| 2003/0022468 A1 | | 1/2003 | Shioya et al. ............... 438/485 |
| 2003/0022519 A1 | | 1/2003 | Fujioka et al. .............. 438/758 |

FOREIGN PATENT DOCUMENTS

| | | | |
|---|---|---|---|
| EP | 0 520 519 | 12/1992 | .......... H01J/37/32 |
| JP | 9 320 966 | 12/1997 | .......... H01L/16/50 |

* cited by examiner

*Primary Examiner*—M. Kornakov
(74) *Attorney, Agent, or Firm*—Moser, Patterson & Sheridan

(57) ABSTRACT

A method for cleaning a plasma enhanced chemical vapor deposition chamber. The method includes introducing a cleaning gas into the plasma enhanced chemical vapor deposition chamber, forming a plasma using a very high frequency (VHF) power having a frequency in a range from about 20 MHz to about 100 MHz, and reacting the cleaning gas with deposits within the chamber in the presence of the plasma.

3 Claims, 2 Drawing Sheets

METHOD FOR CLEANING PLASMA ENHANCED CHEMICAL VAPOR DEPOSITION CHAMBER USING VERY HIGH FREQUENCY ENERGY

CROSS-REFERENCE TO RELATED APPLICATIONS

This application is related to U.S. Ser. No. 10/279,367 (AMAT/7522) by Rocha-Alvarez et al. and entitled "PLASMA ENHANCED CVD LOW K CARBON-DOPED SILICON OXIDE FILM DEPOSITION USING VHF-RF POWER," now issued as U.S. Pat. No. 6,797,643 and which is incorporated herein by reference.

BACKGROUND OF THE INVENTION

1. Field of the Invention

Embodiments of the present invention generally relate to methods for operating a chemical vapor deposition chamber, and more specifically, methods for cleaning the chemical vapor deposition chamber.

2. Description of the Related Art

In the fabrication of integrated circuits and semiconductor devices, materials, such as oxides, are typically deposited on a substrate in a process chamber, such as a plasma-enhanced chemical vapor deposition (PECVD) chamber. The deposition processes often result in deposition of some of the materials on the walls, ceiling and components of the deposition chamber, changing the characteristics of the chamber and giving rise to particulate contamination. Further, since process gases are distributed through a gas distribution plate during processing, a layer of the materials is often formed on the gas distribution plate, which may clog the holes of the plate or flake off as particles that rain down on the substrate, thereby affecting the uniformity of deposition on the substrate and contaminating the substrate. Consequently, it is necessary to clean the interior of the deposition chamber on a regular basis.

Several methods of cleaning the deposition chamber have been developed. For example, a remote plasma cleaning procedure may be employed in which an etchant plasma is generated remote from the deposition chamber by a high density plasma source such as a microwave plasma system, toroidal plasma generator or similar device. Dissociated species from the etchant plasma are then transported to the deposition chamber where they can react with and etch away the undesired deposition build up. It is also common to remove the unwanted deposition material that builds up on the interior of chamber walls with an in situ cleaning procedure. Common in situ techniques include the use of an etchant gas, such as fluorine, to remove the deposited material from the chamber walls and other areas. The etchant gas is introduced into the chamber and plasma is formed so that the etchant gas reacts with and removes the deposited material from the chamber walls.

An in situ cleaning procedure generally provides a faster cleaning rate than the remote plasma cleaning procedure. However, an in situ cleaning procedure also causes more damage to the chamber hardware than the remote plasma cleaning procedure. For instance, one damage that typically occurs with in situ cleaning procedure is generally caused by the ion bombardment on the substrate support pedestal, which generates AlFx (since the support pedestal is generally made from AlN). AlFx in turn condenses on the cooler chamber components, such as the gas distribution plate, thereby generating particles and causing an accelerated drift of film properties.

Therefore, a need exists for an improved method for cleaning a PECVD chamber using the in situ cleaning procedure.

SUMMARY OF THE INVENTION

Embodiments of the present invention are generally directed to a method for cleaning a PECVD chamber. The method includes introducing a cleaning gas into the PECVD chamber, forming a plasma using a very high frequency (VHF) power having a frequency in a range of about 20 MHz to about 100 MHz, and reacting the cleaning gas with deposits within the chamber in the presence of the plasma.

In one embodiment, the invention is directed to a computer readable medium containing a program which, when executed, performs an operation that includes introducing a cleaning gas into the PECVD chamber, forming a plasma using a very high frequency (VHF) power having a frequency in a range of about 20 MHz to about 100 MHz, and reacting the cleaning gas with deposits within the chamber in the presence of the plasma.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
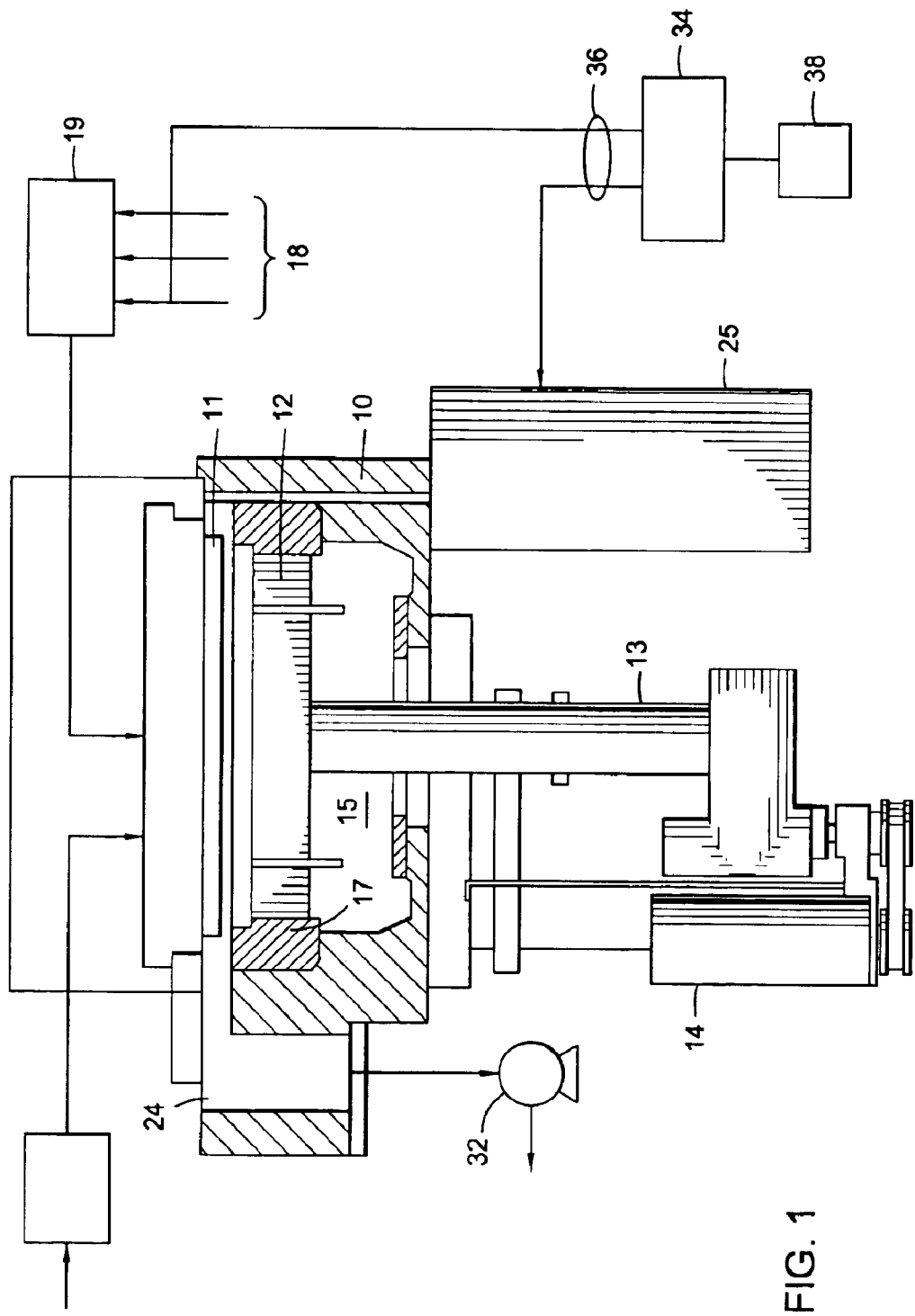
FIG. 1 is a cross-sectional diagram of an exemplary PECVD reactor configured for use according to embodiments described herein.

A detailed description will now be provided. Various terms as used herein are defined below. To the extent a term used in a claim is not defined below, it should be given the broadest definition persons in the pertinent art have given that term, as reflected in printed publications and issued patents. In the description that follows, like parts are marked throughout the specification and drawings with the same reference numerals. The drawings may be, but are not necessarily, to scale and the proportions of certain parts have been exaggerated to better illustrate details and features of the invention.

FIG. 1 illustrates a vertical, cross-section view of a capacitively coupled (parallel plate) plasma-enhanced chemical vapor deposition (PECVD) processing chamber 10. The chamber 10 includes a high vacuum region 15 and a gas distribution manifold 11 having perforated holes for dispersing process gases there-through to a substrate (not shown). The substrate rests on a substrate support pedestal 12, which is mounted on a support stem 13 that connects the substrate support pedestal 12 to a lift motor 14. The lift motor 14 raises and lowers the substrate support pedestal 12 between a processing position and a lower, substrate-loading position so that the substrate support pedestal 12 (and the substrate supported on the upper surface of the substrate support pedestal 12) can be controllably moved between a lower loading/off-loading position and an upper processing position which is closely adjacent to the manifold 11. An insulator 17 surrounds the substrate support pedestal 12 and the substrate when in an upper processing position.

Gases introduced to the manifold 11 are uniformly distributed radially across the surface of the substrate. A vacuum pump 32 having a throttle valve controls the exhaust rate of gases from the chamber 10 through a manifold 24. Deposition and carrier gases, if needed, flow through gas lines 18 into a mixing system 19 and then to the manifold 11. Generally, each process gas supply line 18 includes (i) safety shut-off valves (not shown) that can be used to automatically or manually shut off the flow of process gas into the chamber, and (ii) mass flow controllers (also not shown) to measure the flow of gas through the gas supply lines 18. When toxic gases are used in the process, several safety shut-off valves are positioned on each gas supply line 18 in conventional configurations.

In accordance with an embodiment of the invention for cleaning a chamber, a controlled plasma is formed inside the chamber 10 by a high frequency energy, such as VHF-RF energy, applied to the gas distribution manifold 11 using a high frequency power supply 25 and a cleaning gas is reacted with deposits in the chamber in the presence of the plasma. In another embodiment of a method of cleaning a chamber, the high frequency power may be provided to the substrate support pedestal 12. In yet another embodiment of a method of cleaning a chamber, the high frequency power may be provided to both the gas distribution manifold 11 and the substrate support pedestal 12. The high frequency power supply 25 is configured to supply a single high frequency power between 20 MHz and about 100 MHz, preferably between about 27 MHz and about 100 MHz. In one embodiment, the frequency for the high frequency power supply 25 is about 68 MHz. Alternatively, the high frequency power may be delivered using mixed, simultaneous frequencies to enhance the decomposition of reactive species introduced into the high vacuum region 15. For example, the mixed frequency may include a lower frequency in the range of between about 400 KHz and about 14 MHz and a higher frequency in the range of between 20 MHz and about 100 MHz.

Typically, any or all of the chamber lining, the gas distribution manifold 11, the substrate support pedestal 12, and various other reactor hardware is made out of materials such as aluminum, anodized aluminum or aluminum nitride. An example of such a CVD reactor is described in U.S. Pat. No. 5,000,113, entitled "A Thermal CVD/PECVD Reactor and Use for Thermal Chemical Vapor Deposition of Silicon Dioxide and In-situ Multi-step Planarized Process," issued to Wang et al., and assigned to Applied Materials, Inc., the assignee of the invention, and is incorporated by reference herein to the extent not inconsistent with the invention.

A system controller 34 controls the motor 14, the gas mixing system 19, and the high frequency power supply 25, which are connected therewith by control lines 36. The system controller 34 controls the activities of the CVD reactor and typically includes a hard disk drive, a floppy disk drive, and a card rack. The card rack contains a single board computer (SBC), analog and digital input/output boards, interface boards, and stepper motor controller boards. The system controller 34 conforms to the Versa Modular Europeans (VME) standard, which defines board, card cage, and connector dimensions and types. The VME standard also defines the bus structure having a 16-bit data bus and 24-bit address bus.

Figure 2:
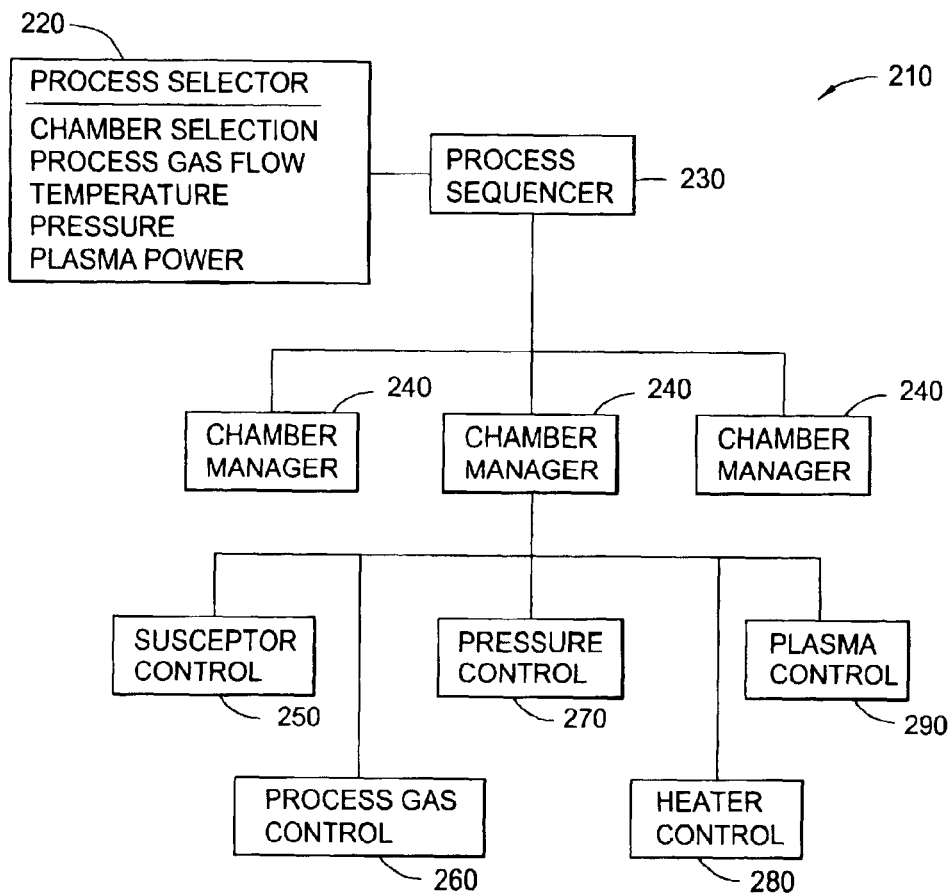
FIG. 2 is a flow chart of a process control computer program product used in conjunction with the exemplary PECVD reactor of FIG. 1.

FIG. 2 shows an illustrative block diagram of a hierarchical control structure of a computer program 210. The system controller 34 operates under the control of the computer program 210 stored on a hard disk drive 38. The computer program 210 dictates the timing, mixture of gases, VHF-RF power levels, the substrate support pedestal position, and other parameters of a particular process. The computer program code can be written in any conventional computer readable programming language such as, for example, 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

A user enters a process set number and process chamber number into a process selector subroutine 220 in response to menus or screens displayed on the CRT monitor by using the light pen interface. The process sets are predetermined sets of process parameters necessary to carry out specified processes, and are identified by predefined set numbers. The process selector subroutine 220 (i) selects a desired process chamber on the cluster tool, and (ii) selects a desired set of process parameters needed to operate the process chamber for performing the desired process. The process parameters for performing a specific process are provided to the user in the form of a recipe and relate to process conditions such as, for example, process gas composition, flow rates, temperature, pressure, plasma conditions such as VHF-RF bias power levels and magnetic field power levels, cooling gas pressure, and chamber wall temperature. The parameters specified by the recipe are entered utilizing the light pen/CRT monitor interface. The signals for monitoring the process are provided by the analog input and digital input boards of the system controller 34 and the signals for controlling the process are output to the analog output and digital output boards of the system controller 34.

A process sequencer subroutine 230 has program code for accepting the identified process chamber and set of process parameters from the process selector subroutine 220, and for controlling operation of the various process chambers. Multiple users can enter process set numbers and process chamber numbers, or a user can enter multiple process chamber numbers, so the sequencer subroutine 230 operates to schedule the selected processes in the desired sequence. Preferably the sequencer subroutine 230 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling a process execute, the sequencer subroutine 230 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 230 determines which process chamber and process set combination is going to be executed next, the sequencer subroutine 230 causes execution of the process set by passing the particular process set parameters to a chamber manager subroutine 240 which controls multiple processing tasks in a process chamber according to the process set determined by the sequencer subroutine 230. For example, the chamber manager subroutine 240 includes program code for controlling CVD process operations in the process chamber 10. The chamber manager subroutine 240 also controls execution of various chamber component subroutines that control operation of the chamber component necessary to carry out the selected process set. Examples of chamber component subroutines are substrate support pedestal control subroutine 250, process gas control subroutine 260, pressure control subroutine 270, heater control subroutine 280, and plasma control subroutine 290. Those having ordinary skill in the art would readily recognize that other chamber control subroutines can be included depending on what processes are desired to be performed in a processing chamber.

In operation, the chamber manager subroutine 240 selectively schedules or calls the process component subroutines in accordance with the particular process set being executed. The chamber manager subroutine 240 schedules the process component subroutines similarly to how the sequencer subroutine 230 schedules which process chamber and process set is to be executed next. Typically, the chamber manager subroutine 240 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 2. The substrate support pedestal control positioning subroutine 250 has program code for controlling chamber components that are used to load the substrate onto the substrate support pedestal 12, and optionally to lift the substrate to a desired height in the processing chamber 10 to control the spacing between the substrate and the gas distribution manifold 11. When a substrate is loaded into the processing chamber 10, the substrate support pedestal 12 is lowered to receive the substrate, and thereafter, the substrate support pedestal 12 is raised to the desired height in the chamber to maintain the substrate at a first distance or spacing from the gas distribution manifold 11 during the CVD process. In operation, the substrate support pedestal control subroutine 250 controls movement of the substrate support pedestal 12 in response to process set parameters that are transferred from the chamber manager subroutine 240.

The process gas control subroutine 260 has program code for controlling process gas compositions and flow rates. The process gas control subroutine 260 controls the open/close position of the safety shut-off valves, and also ramps up/down the mass flow controllers to obtain the desired gas flow rate. The process gas control subroutine 260 is invoked by the chamber manager subroutine 240, as are all chamber components subroutines, and receives from the chamber manager subroutine process parameters related to the desired gas flow rates. Typically, the process gas control subroutine 260 operates by opening the gas supply lines, and repeatedly (i) reading the necessary mass flow controllers, (ii) comparing the readings to the desired flow rates received from the chamber manager subroutine 240, and (iii) adjusting the flow rates of the gas supply lines as necessary. Furthermore, the process gas control subroutine 260 includes steps for monitoring the gas flow rates for unsafe rates, and activating the safety shut-off valves when an unsafe condition is detected.

In some processes, an inert gas such as helium or argon is put into the processing chamber 10 to stabilize the pressure in the chamber before reactive process gases are introduced. For these processes, the process gas control subroutine 260 is programmed to include steps for flowing the inert gas into the chamber 10 for an amount of time necessary to stabilize the pressure in the chamber, and then the steps described above would be carried out.

Additionally, when a process gas is to be vaporized from a liquid precursor, such as OMCTS for example, the process gas control subroutine 260 would be written to include steps for bubbling a carrier/delivery gas such as argon, helium, nitrogen, hydrogen, carbon dioxide, ethylene, or mixtures thereof, for example, through the liquid precursor in a bubbler assembly. The carrier gas typically has a flowrate between about 100 sccm to about 10,000 sccm, preferably 1,000 sccm.

For this type of process, the process gas control subroutine 260 regulates the flow of the delivery gas, the pressure in the bubbler, and the bubbler temperature in order to obtain the desired process gas flow rates. As discussed above, the desired process gas flow rates are transferred to the process gas control subroutine 260 as process parameters. Furthermore, the process gas control subroutine 260 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 270 has program code for controlling the pressure in the processing chamber 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 270 is invoked, the desired, or target pressure level is received as a parameter from the chamber manager subroutine 240. The pressure control subroutine 270 operates to measure the pressure in the processing chamber 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 270 can be written to open or close the throttle valve to a particular opening size to regulate the processing chamber 10 to the desired pressure.

The heater control subroutine 280 has program code for controlling the temperature of the heat modules or radiated heat that is used to heat the substrate support pedestal 12. The heater control subroutine 280 is also invoked by the chamber manager subroutine 240 and receives a target, or set point, temperature parameter. The heater control subroutine 280 measures the temperature by measuring voltage output of a thermocouple located in a substrate support pedestal 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 280 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the processing chamber 10 is not properly set up.

The plasma control subroutine 290 includes program code for setting the VHF-RF bias voltage power level applied to the process electrodes in the processing chamber 10, and optionally, to set the level of the magnetic field generated in the reactor. Similar to the previously described chamber component subroutines, the plasma control subroutine 290 is invoked by the chamber manager subroutine 240.

The pretreatment and method for forming a pretreated layer of the present invention is not limited to any specific apparatus or to any specific plasma excitation method. The above CVD system description is mainly for illustrative purposes, and other CVD equipment such as electrode cyclotron resonance (ECR) plasma CVD devices, induction-coupled RF high density plasma CVD devices, or the like may be employed. Additionally, variations of the above described system such as variations in substrate support pedestal design, heater design, location of power connections and others are possible. For example, the substrate could be supported and heated by a resistively heated substrate support pedestal.

Figure 3:
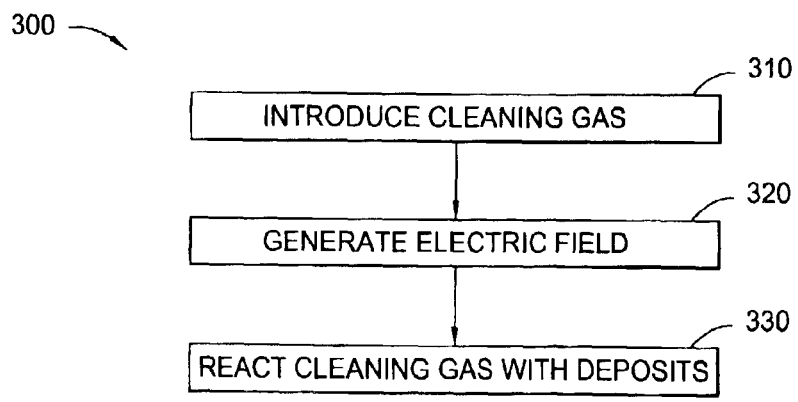
FIG. 3 illustrates a flow chart of a process for cleaning a PECVD chamber in accordance with an embodiment of the invention.

FIG. 3 illustrates an in situ cleaning process 300 for cleaning a PECVD chamber in accordance with one embodiment of the invention. At step 310, a cleaning gas is introduced into the PECVD chamber 10 through the gas distribution manifold 11. The cleaning gas may be a halogen-containing gas, such as a fluorine-containing gas. In one embodiment, the cleaning gas is $NF_3$. Examples of cleaning gases include $F_2$, $C_2F_4$, $SF_6$, $C_2F_6$, $CCl_4$, and $C_2Cl_6$. At step 320, a plasma is formed within the chamber 10. The plasma may be formed by applying an electric field to the cleaning gas. The electric field is generated by connecting the substrate support pedestal 12 to the high frequency power supply 25 configured to supply power having a frequency in a range from 20 MHz to about 100 MHz, preferably between about 27 MHz and 100 MHz. In one embodiment, the VHF power has a frequency of about 68 MHz. The VHF power may be in a range of about 50 Watts to about 2000 Watts. Alternatively, the high frequency power supply 25 may be coupled to the gas distribution manifold 11, or to both the gas distribution manifold 11 and the substrate support pedestal 12. The high frequency power may be delivered using mixed, simultaneous frequencies to enhance the decomposition of reactive species introduced into the high vacuum region 15. For example, the mixed frequency may include a lower frequency in the range of between about 400 KHz and about 14 MHz and a higher frequency in the range of between 20 MHz and about 100 MHz. At step 330, the cleaning gas reacts with deposits within the chamber 10 in the presence of the plasma until the deposits are consumed. In one embodiment, the in situ cleaning process 300 is used to clean low k film deposits and residue, such as carbon doped silicon oxide deposits with a dielectric constant of less than about 2.5. During cleaning, the pressure in the chamber ranges from about 500 mTorr to about 10 Torr.

Using the very high frequency power to generate the electric field provides a lower ion bombardment on the electrodes, such as the substrate support pedestal 12. In this manner, particle build up on chamber components that may lead to contamination is reduced. Furthermore, using the high frequency energy provides a higher electron density, allowing a faster cleaning rate at lower power consumption.

While the foregoing is directed to embodiments of the present invention, other and further embodiments of the invention may be devised without departing from the basic scope thereof, and the scope thereof is determined by the claims that follow.

What is claimed is:

1. A method for cleaning a plasma-enhanced chemical vapor deposition chamber, comprising:

introducing a cleaning gas into the plasma-enhanced chemical vapor deposition chamber;

forming a plasma using a very high frequency (VHF) power having a frequency in a range of about 27 MHz to about 100 MHz; and reacting the cleaning gas with deposits within the chamber in the presence of the plasma, wherein the VHF power is applied to a substrate support pedestal disposed within the chamber.

2. A method for cleaning a plasma-enhanced chemical vapor deposition chamber, comprising:

introducing a cleaning gas into the plasma-enhanced chemical vapor deposition chamber;

forming a plasma using a very high frequency (VHF) power having a frequency in a range of about 27 MHz to about 100 MHz; and reacting the cleaning gas with deposits within the chamber in the presence of the plasma, wherein the VHF power is applied to a gas distribution manifold disposed within the chamber.

3. A method for cleaning a plasma-enhanced chemical vapor deposition chamber, comprising:

introducing a cleaning gas into the plasma-enhanced chemical vapor deposition chamber;

forming a plasma using a very high frequency (VHF) power having a frequency in a range of about 27 MHz to about 100 MHz; and reacting the cleaning gas with deposits within the chamber in the presence of the plasma, wherein the chamber comprises capacitively coupled parallel plate electrodes.

* * * * *